United States Patent
Zimmerhackl et al.

(10) Patent No.: US 8,047,762 B2
(45) Date of Patent: Nov. 1, 2011

(54) METHOD AND SYSTEM FOR LOCALLY BUFFERING SUBSTRATE CARRIERS IN AN OVERHEAD TRANSPORT SYSTEM FOR ENHANCING INPUT/OUTPUT CAPABILITIES OF PROCESS TOOLS

(75) Inventors: Olaf Zimmerhackl, Lohmen (DE); Alfred Honold, Bad Abbach (DE); Jan Rothe, Dresden (DE)

(73) Assignee: GLOBALFOUNDRIES Inc., Austin, TX (US)

( * ) Notice: Subject to any disclaimer, the term of this patent is extended or adjusted under 35 U.S.C. 154(b) by 379 days.

(21) Appl. No.: 12/032,857

(22) Filed: Feb. 18, 2008

(65) Prior Publication Data
US 2009/0035102 A1    Feb. 5, 2009

(30) Foreign Application Priority Data
Jul. 31, 2007   (DE) .......................... 10 2007 035 839

(51) Int. Cl.
*B65G 1/00* (2006.01)
(52) U.S. Cl. .................... 414/806; 414/222.07; 414/940
(58) Field of Classification Search .............. 414/940, 414/217.1, 222.07, 222.13, 806
See application file for complete search history.

(56) References Cited

U.S. PATENT DOCUMENTS

| | | | |
|---|---|---|---|
| 5,570,990 A * | 11/1996 | Bonora et al. ............... | 414/543 |
| 6,009,890 A | 1/2000 | Kaneko et al. .............. | 134/133 |
| 6,169,935 B1 * | 1/2001 | Iwasaki et al. ............. | 700/214 |
| 6,183,184 B1 * | 2/2001 | Shiwaku ..................... | 414/281 |
| 6,280,134 B1 * | 8/2001 | Nering ........................ | 414/217 |
| 6,336,546 B1 * | 1/2002 | Lorenz ...................... | 198/346.2 |
| 6,540,466 B2 * | 4/2003 | Bachrach ................... | 414/217 |
| 7,024,275 B2 * | 4/2006 | Lai ............................ | 700/228 |
| 7,261,510 B2 * | 8/2007 | Motoori et al. ............ | 414/281 |
| 7,413,396 B2 * | 8/2008 | Ito ............................. | 414/626 |
| 7,441,999 B2 * | 10/2008 | Nakao et al. ............. | 414/217.1 |
| 7,771,151 B2 * | 8/2010 | Bonora et al. ............ | 414/217.1 |
| 7,780,020 B2 * | 8/2010 | Yoshitaka ................. | 212/332 |
| 7,887,278 B2 * | 2/2011 | Hoshino .................... | 414/217.1 |
| 7,891,929 B2 * | 2/2011 | Yamamoto et al. ........ | 414/281 |
| 7,972,104 B2 * | 7/2011 | Shiwaku et al. .......... | 414/282 |
| 2003/0190223 A1 * | 10/2003 | Peiter ........................ | 414/542 |
| 2004/0109746 A1 * | 6/2004 | Suzuki ...................... | 414/373 |
| 2005/0191162 A1 | 9/2005 | Chang et al. .............. | 414/626 |
| 2006/0051192 A1 * | 3/2006 | Fujiki ........................ | 414/626 |
| 2006/0088272 A1 * | 4/2006 | Gilchrist et al. .......... | 385/147 |
| 2006/0222479 A1 * | 10/2006 | Shiwaku et al. .......... | 414/267 |

FOREIGN PATENT DOCUMENTS
GB    EP 1 627 834 A1    2/2006

OTHER PUBLICATIONS

Letter from foreign associate mailed May 13, 2008.
Translation of Official Communication issued Mar. 10, 2008.
Letter from foreign associate mailed Aug. 9, 2011.
Translation of Official Communication issued Aug. 1, 2011.

* cited by examiner

*Primary Examiner* — James Keenan
(74) *Attorney, Agent, or Firm* — Williams, Morgan & Amerson

(57) ABSTRACT

By providing an overhead buffer system between an automatic transport system and a load port assembly of a process tool, the efficiency of the respective load ports may be significantly enhanced, for instance, by reducing the idle time of empty carriers, thereby providing the potential for covering a wider range of operational scenarios compared to conventional strategies. For instance, for the same number of load ports, the overhead buffer system may provide a continuous operation, even if small lot sizes are used. The buffer system may comprise a dedicated transport mechanism for directly serving the load ports and respective buffer places, while respective transfer places may provide direct interaction with the automated transport system.

16 Claims, 10 Drawing Sheets

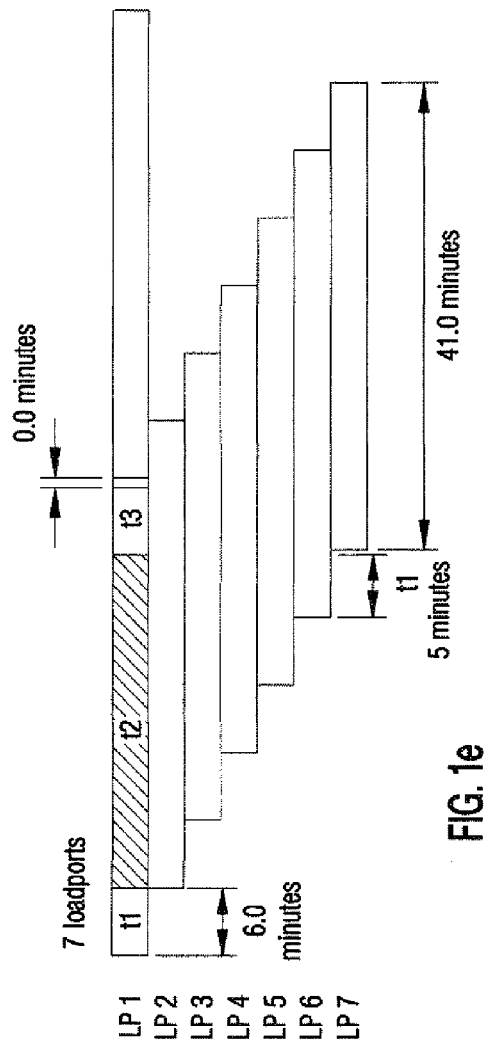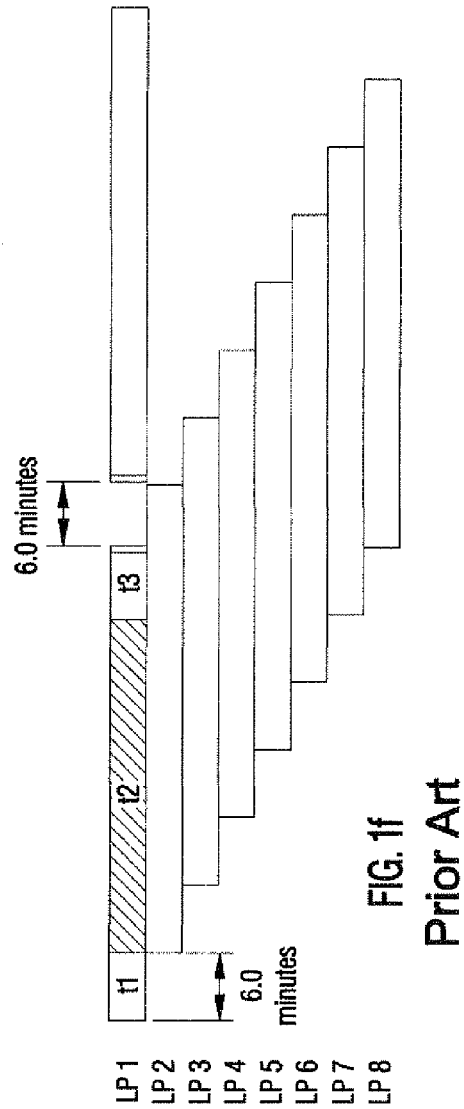
FIG. 1e Prior Art
FIG. 1f Prior Art

_METHOD AND SYSTEM FOR LOCALLY BUFFERING SUBSTRATE CARRIERS IN AN OVERHEAD TRANSPORT SYSTEM FOR ENHANCING INPUT/OUTPUT CAPABILITIES OF PROCESS TOOLS_

BACKGROUND OF THE INVENTION

1. Field of the Invention

Generally, the present disclosure relates to the field of fabricating products, such as semiconductor devices, in a manufacturing environment including process tools exchanging transport carriers with an automated transport system, wherein the products, such as substrates for semiconductor devices, are processed on the basis of groups or lots defined by the contents of the transport carriers.

2. Description of the Related Art

Today's global market forces manufacturers of mass products to offer high quality devices at a low price. It is thus important to improve yield and process efficiency to minimize production costs. This holds especially true in the field of semiconductor fabrication, since, here, it is essential to combine cutting-edge technology with volume production techniques. It is, therefore, the goal of semiconductor manufacturers to reduce the consumption of raw materials and consumables while at the same time improve process tool utilization. The latter aspect is especially important since, in modern semiconductor facilities, equipment is required which is extremely cost intensive and represents the dominant part of the total production costs.

Integrated circuits are typically manufactured in automated or semi-automated facilities, by passing substrates comprising the devices through a large number of process and metrology steps to complete the devices. The number and the type of process steps and metrology steps a semiconductor device has to go through depends on the specifics of the semiconductor device to be fabricated. A usual process flow for an integrated circuit may include a plurality of photolithography steps to image a circuit pattern for a specific device layer into a resist layer, which is subsequently patterned to form a resist mask for further processes in structuring the device layer under consideration by, for example, etch or implant processes and the like. Thus, layer after layer, a plurality of process steps are performed based on a specific lithographic mask set for the various layers of the specified device. For instance, a sophisticated CPU requires several hundred process steps, each of which has to be carried out within specified process margins to fulfill the specifications for the device under consideration. Since many of these processes are very critical, such as many photolithography steps, a plurality of metrology steps have to be performed to efficiently control the process flow and to monitor the performance of the respective process tools. For example, so-called pilot substrates are frequently processed and subjected to measurement procedures prior to actually releasing the associated group of "parent" substrates in order to test the compliance with predefined process margins. Typical metrology processes may include the measurement of layer thickness, the determination of dimensions of critical features, such as the gate length of transistors, the measurement of dopant profiles and the like. As the majority of the process margins are device specific, many of the metrology processes and the actual manufacturing processes are specifically designed for the device under consideration and require specific parameter settings at the adequate metrology and process tools.

In a semiconductor facility, a plurality of different product types are usually manufactured at the same time, such as memory chips of different design and storage capacity, CPUs of different design and operating speed and the like, wherein the number of different product types may even reach a hundred and more in production lines for manufacturing ASICs (application specific ICs). Since each of the different product types may require a specific process flow, different mask sets for the lithography, specific settings in the various process tools, such as deposition tools, etch tools, implantation tools, chemical mechanical polishing (CMP) tools and the like, may be necessary. Consequently, a plurality of different tool parameter settings and product types may be encountered simultaneously in a manufacturing environment. Thus, a mixture of product types, such as test and development products, pilot products, different versions of products, at different manufacturing stages may be present in the manufacturing environment at a time, wherein the composition of the mixture may vary over time depending on economic constraints and the like, since the dispatching of non-processed substrates into the manufacturing environment may depend on various factors, such as the ordering of specific products, a variable degree of research and development efforts and the like. Thus, frequently, the various product types may have to be processed with a different priority to meet requirements imposed by specific economic or other constraints.

Despite these complex conditions, it is an important aspect with respect to productivity to coordinate the process flow within the manufacturing environment in such a way that high performance, for example, in terms of tool utilization, of the process tools is achieved, since the investment costs and the moderately low "life span" of process tools, particularly in a semiconductor facility, significantly determine the price of the final semiconductor devices. In modern semiconductor facilities, a high degree of automation is typically encountered, wherein the transport of substrates from and to the process and metrology tools is accomplished on the basis of respective transport carriers accommodating a specific maximum number of substrates. The number of substrates contained in a carrier is also referred to as a lot and the number of substrates is therefore frequently called the lot size. In a highly automated process line of a semiconductor facility, the transport of the carriers is mainly performed by an automated transport system that picks up a carrier at a specific location, for example, a load port associated with a process or metrology tool, within the environment and delivers the carrier to its destination, for instance, a load port of another process or metrology tool that may perform the next process or processes required in the respective process flow of the products under consideration. Thus, the products in one carrier typically represent substrates to be processed in the same process tool, wherein the number of substrates in the carrier may not necessarily correspond to the maximum number of possible substrates. That is, the lot size of the various carriers may vary, wherein typically a "standard" lot size may dominate in the manufacturing environment. For example, one or more pilot substrates, which may be considered as representatives of a certain number of parent substrates contained in a certain number of carriers filled with the standard lot size, may be transported in a separate carrier, since they may undergo a specific measurement process and therefore may have to be conveyed to a corresponding metrology tool, thereby requiring an additional transport job. Based on the results of the measurement process, the waiting parent substrates may then be delivered to the respective process tool.

The supply of carriers to and from process tools is usually accomplished on the basis of respective "interfaces," also referred to as loading stations or load ports, which may receive the carriers from the transport system and hold the carriers to be picked up by the transport system. The transport system comprises a rail system that is typically attached to the clean room ceiling so that the transport system is usually referred to as an overhead transport system (OHT). Furthermore, the OHT accommodates a plurality of vehicles running along the OHT rails in order to convey a transport carrier that is to be exchanged with a specific process tool by means of one or more load ports associated with the tool under consideration. Due to the increasing complexity of process tools, having implemented therein a plurality of functions, the cycle time for a single substrate may increase. Hence, when substrates are not available at the tool although being in a productive state, significant idle times or unproductive times may be created, thereby significantly reducing the utilization of the tool. Thus, typically, the number and configuration of the load ports is selected such that one or more carriers may be exchanged at the load port(s) while the functional module of the process tool receives substrates from another load port to achieve a cascaded or continuous operation of the functional module of the process tool. The time for the exchange of carriers between the automated transport system and the respective process or metrology tool depends on the transport capacity of the transport system and the availability of the carrier to be conveyed at its source location. Ideally, when a corresponding transport request for a specified lot currently processed in a source tool is to be served, the respective substrates should be available at the time the transport system picks up the carrier including the lot and delivers the carrier at the destination tool such that a continuous operation may be maintained. Consequently, the respective carrier should be delivered to the destination tool when or before the last substrate of the carrier currently processed in the destination tool is entered into the process module so that a continuous operation may be achieved on the basis of the newly arrived carrier. Thus, for an ideal continuous operation of a process tool, one carrier would be exchanged while another carrier is currently processed.

Depending on the capacity of the tool interface, for instance, the number of load ports provided, a certain buffer of carriers and thus substrates may be provided in order to generate a certain tolerance for delays and irregular deliveries, which may, however, significantly contribute to tool costs. In some circumstances, the required carrier exchange time for maintaining a continuous operation of the tool under consideration may even be negative, thereby requiring a change of the substrate handling scenario. Moreover, the actual carrier exchange time, i.e., the time required for picking up a full carrier including processed substrates from the load port and putting a carrier onto the load port to provide new substrates to be processed, does not substantially depend on the lot size, whereas the time window for the opportunity to perform an actual carrier exchange is highly dependent on the respective lot size, since a small currently processed lot provides only a reduced time interval for exchanging another carrier without producing an undesired idle time, also referred to as a window of opportunity for carrier exchange. Thus, the presence of a mixture of lot sizes, such as pilot lots, development lots and the like, or the presence of lots having a high priority, may negatively affect the overall performance of process tools.

Moreover, in view of cycle time enhancement for the individual products and to address flexibility in coping with customers' specific demands, the lot size may decrease in future process strategies. For example, currently 25 wafers per transport carrier may be a frequently used lot size, wherein, however, many lots may have to be handled with a lesser number of wafers due to the above requirements, thereby imposing a high burden on the process capabilities of the automatic transport system and the scheduling regime in the facility in order to maintain a high overall tool utilization. That is, the variability of the carrier exchange times for exchanging the carriers with respective load stations of the process tools may be high and thus a significant influence of the transport status in the manufacturing environment on the overall productivity may be observed. Thus, when designing or re-designing a manufacturing environment, for instance, by installing new or additional equipment, the tool characteristics with respect to transport capabilities, such as the number of load ports for specific tools and the like, and the capabilities and operational behavior of the automatic material handling system (AMHS) may represent important factors for the performance of the manufacturing environment as a whole. The handling of small and different lot sizes within the manufacturing environment that is designed for a moderately large standard lot size may, therefore, require highly sophisticated scheduling regimes to compensate for the lack of sufficient carrier exchange capacity in the existing tools. However, the presence of small lot sizes may nevertheless result in a significant reduction of tool utilization, in particular in photolithography tools and related process tools, which are responsible for an essential part of the total production costs, as previously explained, due to the fact that a negative carrier exchange time that may be associated with the processing of small lot sizes may not be compensated for, unless significant modifications of the process tools under consideration are made in view of increasing the I/O capabilities of the tool. That is, the number of load ports may have to be increased, as will be described in more detail with reference to FIGS. 1a-1f.

FIG. 1a schematically illustrates a cross-sectional view of a manufacturing environment 150 representing a portion of a semiconductor facility for manufacturing microstructure features, such as integrated circuits and the like. The manufacturing environment 150 is typically established within a clean room, in which the environmental conditions, such as temperature, humidity, the number of airborne particles and the like, are controlled to be within tightly set ranges. Consequently, the floor space within a respective clean room is very expensive, wherein the productivity per unit area of the clean room may contribute significantly to the overall production costs of semiconductor devices. The manufacturing environment 150 comprises a plurality of process tools, such as lithography tools, etch tools, deposition tools, anneal tools and the like, wherein, for convenience, a single process tool 160 is illustrated in FIG. 1a, which may represent a lithography tool, possibly in combination with any related process tools required for performing sophisticated lithography processes as are typically necessary for the formation of advanced semiconductor devices. For example, the process tool 160 may represent one or more exposure tools in combination with other process modules required for depositing a photoresist, baking the resist, developing the resist and the like. As previously explained, lithography processes may represent one of the most cost-intensive process steps, in particular when highly critical exposure steps are considered, such as the patterning of gate electrodes and the like. The process tool 160 may be associated with a carrier exchange interface 161, which may be provided in the form of a plurality of load ports that are configured to receive substrate carriers including substrates to be processed and to feed the substrates contained therein into the process modules included in the process tool 160. Furthermore, the manufacturing environment 150 comprises an overhead transport (OHT) system 170, which typically comprises appropriate transport rails 171 configured to accommodate and guide transport vehicles 172 which in turn are configured to receive substrate carriers 173 that are to be exchanged with the interface 161. For this purpose, typically, the transport vehicles 172 are appropriately configured to pick up a respective substrate carrier 173 from a source load port of a process tool within the manufacturing environment 150 and convey the carrier 173 on the basis of the rails 171 to a destination within the environment 150, such as the process tool 160. For this purpose, the rails 171 are typically attached to the ceiling 174 of the respective clean room such that the vehicles 172 containing the carrier 173 under consideration may be positioned vertically above a respective one of the load ports of the interface 161. Based on an appropriately designed mechanism (not shown), the carrier 173 may be hoisted down so as to be positioned on the respective load port.

FIG. 1b schematically illustrates a top view of the manufacturing environment 150 as shown in FIG. 1a wherein, by way of example, the process tool 160 is connected to the interface 161 having five load ports indicated as L1, L2, L3, L4, L5. As shown, one of the rails 171 may be positioned such that the corresponding transport vehicles 172 moving in the downward direction of FIG. 1b may be positioned above a respective one of the load ports L1, L2, L3, L4, L5, depending on whether any of the load ports L1, L2, L3, L4, L5 is available for receiving the substrate carrier 173 or has a corresponding substrate carrier 173 that has to be picked up by the vehicle 172.

During operation of the manufacturing environment 150, a supervising control system, such as an MES (manufacturing execution system) (not shown), typically provided in complex manufacturing environments, may identify a group of substrates, also referred to as a lot, that has to be processed in the process tool 160. In this case, the group of substrates may be positioned in one of the carriers 173 and this carrier 173 may be picked up by the transport system 170 from a corresponding load port of a source process tool or any other location within the manufacturing environment 150. Upon arriving at the process tool 160, an available load port may be identified and the respective carrier 173 may be positioned at this load port and may then be unloaded to supply the substrates to the tool internal process modules for performing one or more processes required by the specific process flow for the substrates under consideration. As previously mentioned, in modern semiconductor facilities, not only the quality of respective processes has to be monitored and maintained within tight process margins, but also the throughput of the process tool 160 is an important factor in view of overall production costs. Therefore, it is an important aspect in managing the complex manufacturing environment 150 to supply substrates to the tool internal modules in a substantially continuous manner to substantially avoid idle times of the process modules of the tool 160. Consequently, the scheduling of the arrival of substrate carriers 173 is typically performed in such a manner that the substrate carriers 173 arrive at the various load ports L1, L2, L3, L4, L5 without resulting in undue idle times of the process tool 160. For example, the lot size in the manufacturing environment 160 may typically be 25 substrates per carrier 173 and the number of load ports of the interface 161 is typically selected so as to allow the arrival of a sufficient number of substrate carriers 173 in order to obtain a substantially continuous operation of the process tool 160.

By way of example, the process tool 160 may represent a lithography tool or a respective tool cluster designed for a throughput of approximately 120 substrates per hour, wherein the tool internal process modules may receive 70 substrates until the first substrate is output back to the carrier exchange interface 161. In a typical process regime, a substrate carrier 173 is received by one of the load ports L1, L2, L3, L4, L5, is unloaded and waits until the substrates are processed by the tool 160 and are returned to the same substrate carrier 173. That is, the substrate carriers 173 used for transport of substrates to respective load ports of the interface 161 have to stay attached to the load ports, while the substrates are being processed in the tool 160. Under these conditions, the continuous processing in the process tool 160 may be obtained by providing an appropriate number of load ports in the interface 161, thereby ensuring that a sufficient number of substrates are present in the process tool 160 at any time. However, there is a general tendency for reducing the number of substrates per lot, for instance using 12 substrates per lot instead of 25, in order to reduce the overall process time for a single substrate. In future strategies for operating semiconductor facilities, even smaller lot sizes have been proposed wherein, in view of flexibility and reduction of overall process time, lot sizes as small as one substrate may be used, in particular if the size of the individual substrates is increased. Thus, when reducing the lot size several, process tools may run into throughput problems due to a non-continuous operation of the process tool, since the existing number of load ports may not allow a continuous operation.

FIG. 1c schematically illustrates a timing diagram for the operation of the process tool 160 under the above-specified conditions, i.e., a throughput of 120 substrates per hour with 70 substrates being simultaneously processed within the tool internal process modules of the tool 160.

In FIG. 1c, load port LP1 may have received a substrate carrier 173, the substrates of which may immediately be loaded into the tool 160, wherein it may be assumed that the respective transport activities in the load ports LP1, LP2, LP3, LP4, LP5, performed by appropriately designed substrate handling systems (not shown), may take 12.5 minutes for unloading 25 substrates. Thus, after the time interval t1, 25 substrates are in the tool internal modules of the tool 160. Thereafter the substrate carrier remains empty on the load port LP1, representing an idle time interval t2 of the load port LP1. Since the other load ports LP2, LP3, LP4, LP5 may have also received or may still receive respective substrate carriers 173, thereby further feeding the tool 160 for maintaining a continuous operation, the idle time t2 may be 22.5 minutes for the load port LP1 until receiving a substrate back from the tool 160. It may, for instance, be assumed, as shown in FIG. 1c, that the load ports LP1, LP2, LP3, LP4, LP5 are sequentially served and hence, after a respective time interval t1 corresponding to the load port LP2, 50 substrates are within the tool 160 when a restart situation with a previously empty tool 160 is considered, thereby requiring another 10 minutes of the time interval t1 associated with the load port LP3, until 70 substrates are in the tool 160. Thereafter, during the time interval t3, which may also take 12.5 minutes, the substrates are sequentially returned to LP1, while the remaining substrates of the carrier on LP3 and further substrates of the carrier on load port LP4 are continuously supplied to the tool 160. Thus, after 10 minutes of time interval t1 corresponding to LP4, the carrier at the load port LP1 is refilled and is ready for being picked up by a vehicle 172 of the transport system 170. In the next 2.5 minutes, the remaining substrates of the carrier at load port LP4 are supplied and thereafter substrates of a carrier positioned on load port LP5 are supplied to the tool 160, thereby providing a time interval t4 of 15 minutes for preparing the carrier for being picked up, positioning a new carrier at the load port LP1 and preparing the newly supplied carrier for supplying substrates to the tool 160. For instance, it may be assumed that corresponding activities, such as closing the substrate carrier, opening the substrate carrier and the like, may take approximately 0.5 minutes, so that a time period of 14 minutes may remain for a carrier exchange with the transport system 170. A corresponding time window is typically within the transport capabilities of the system 170. Hence, for maintaining a substantially continuous operation on the basis of a standard lot size of 25 substrates per carrier, the provision of five load ports for the interface 161 seems to be appropriate.

FIG. 1*d* schematically illustrates a timing diagram for a situation in which the interface 161 comprises only four load ports LP1, LP2, LP3, LP4 for otherwise identical conditions. Since substrates have to be supplied to the tool 160 by a new carrier of LP1 after the carrier of load port LP4 has been emptied, the time interval t4 in FIG. 1*d* is reduced by 12.5 minutes, thereby resulting in a time window of 1.5 minutes as the respective carrier exchange time. However, a corresponding small carrier exchange time may be beyond the capabilities of the transport system 170, thereby rendering this solution as less attractive, even though significant cost savings may be obtained due to reduced floor space and investment costs for providing the interface 161 having a reduced number of load ports.

FIG. 1*e* schematically illustrates a timing diagram for operating the process tool 160 on the basis of a small standard lot size, for instance 12 substrates per lot, while additionally it is assumed that seven load ports LP1, LP2, LP3, LP4, LP5, LP6, LP7 may be provided for the interface 161. Other operating conditions regarding the process tool 160 may be identical to those described above with reference to FIGS. 1*c*-1*d*. As shown, the time interval t1 at load port LP1 is therefore 6 minutes, followed by the time interval t2 which lasts 29 minutes, representing a period in which a respective substrate carrier 173 is positioned at the corresponding load port waiting for the substrates to return from the tool 160. Consequently, during the time interval t1 at load port LP6, ten substrates are unloaded during the first five minutes, thereby providing the required 70 substrates to the tool 160, while the remaining two substrates from load port LP6 and the time interval t1 of the load port LP7 have to cover the time required for loading the substrates returning to load port LP1 into the respective substrate carrier. Consequently, time interval t3 is 1 minute, thereby resulting in a respective time window or carrier exchange time of 0 minutes.

FIG. 1*f* schematically illustrates a timing diagram for an operating situation in which the interface 161 comprises eight load ports LP1, LP2, LP3, LP4, LP5, LP6, LP7, LP8 in order to increase the respective time interval t4 to 7 minutes, thereby obtaining a carrier exchange time of 6 minutes, which may be within the capabilities of the transport system 170.

As a consequence, by reducing the standard lot size from 25 substrates, as illustrated in FIGS. 1*c*-1*d*, to 12 substrates, the number of load ports has to be increased, which would involve considerable hardware modifications in the environment 150, or which may even be not feasible for many existing manufacturing environments. Consequently, a significant loss of throughput of the process tool 160 may result since the corresponding carrier exchange time may even be negative when using less than seven load ports in the scenario illustrated with reference to FIGS. 1*e*-1*f*. The situation may become even worse if the processing of pilot substrates, engineering lots and the like are taken into consideration, which may usually have a lesser number of substrates, such as one substrate per lot and the like, since, in this case, the carrier exchange time in the "vicinity" of the processing of the pilot substrates may be influenced by the presence of corresponding lots, thereby contributing to a throughput loss of the process tool 160.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique for the handling of substrates in a complex manufacturing environment, wherein increased flexibility with respect to substrate handling may be achieved during the exchange of substrate carriers between an automated overhead transport system and a corresponding interface of process tools, thereby providing the potential for a substantially continuous supply of substrates with a moderately low number of load ports. For this purpose, the methods and systems disclosed herein contemplate the reduction of idle times of substrate carriers positioned on load ports of process tools by providing the possibility for removing empty substrate carriers and/or allowing an operational mode in which substrates processed by a process tool may return to a different substrate carrier. In order to support these operating modes, i.e., removing the substrate carriers after unloading the substrates or allowing return of the substrates to different substrate carriers, an overhead buffer system is provided as an interface between the automated overhead transport system and the tool specific interface including a moderately low number of load ports. The overhead buffer system provides local buffer places for full and empty carriers associated with the respective tool internal interface, wherein a dedicated vehicle provides the required transport activities between the buffer places and the tool internal interface. Consequently, the access times for substrate carriers positioned on any load ports of the process tool may be substantially decoupled from any carrier exchange times of the automated overhead transport system, thereby resolving the problem of negative carrier exchange times when operating the manufacturing environment on the basis of small lot sizes. By providing the buffer system as an overhead system, in some illustrative aspects, the automated overhead transport system may directly interact with respective buffer places, i.e., transfer places, for supplying and picking up full substrate carriers without requiring additional handling activities such as opening and closing of respective substrate carriers and the like. Moreover, additional clean room floor space may not be required for installing the overhead buffer system, thereby providing the potential for installing the system into existing manufacturing environments without significant modifications. Further, the front end of the respective process tool may remain fully accessible for operator interaction, such as maintenance, manual loading of substrates and the like.

One illustrative method disclosed herein relates to the exchange of transport carriers with a process tool of a manufacturing environment wherein the method comprises supplying a first transport carrier to a local transport carrier buffer system by a first vehicle of an overhead transport system. The method further comprises receiving the first transport carrier in a first one of a plurality of buffer places of the buffer system by directly transferring the first transport carrier from the first vehicle to the first buffer place. Furthermore, the first transport carrier is transferred from the first buffer place to a second vehicle that is movable independently with respect to the first vehicle. Additionally, the method comprises supplying the first transport carrier to a first load port of the process tool by means of the second vehicle.

Another illustrative method disclosed herein comprises exchanging one or more substrates contained as one or more groups in one or more substrate carriers between an overhead transport system and an overhead carrier buffer system of a manufacturing environment, wherein the one or more substrates are dedicated for processing in a specific tool of the manufacturing environment. The method further comprises exchanging the one or more substrate carriers between the overhead buffer system and load ports of the specific process tool by moving a dedicated vehicle of the overhead buffer system in a reciprocating manner between the load ports so as to supply and pick up the one or more substrate carriers for processing in the specific process tool, wherein the dedicated vehicle of the overhead buffer system is movable independently from any vehicles used in the overhead transport system.

An illustrative overhead buffer system for a manufacturing environment that comprises an automated overhead transport system for distributing substrate carriers within the manufacturing environment is provided. The overhead buffer system comprises a plurality of buffer places configured to receive a plurality of substrate carriers. The overhead buffer system further comprises a rail extending along a plurality of load ports of a process tool of the manufacturing environment. Furthermore, a buffer vehicle is provided and is configured to be locally movable along the rail independently of transport activities of the overhead transport system.

BRIEF DESCRIPTION OF THE DRAWINGS

The disclosure may be understood by reference to the following description taken in conjunction with the accompanying drawings, in which like reference numerals identify like elements, and in which:

FIGS. 1e-1f represent respective timing diagrams for illustrating the respective carrier exchange times and idle times of substrate carriers when operating the manufacturing environment on the basis of small lot sizes according to conventional strategies;

Figure 1A:
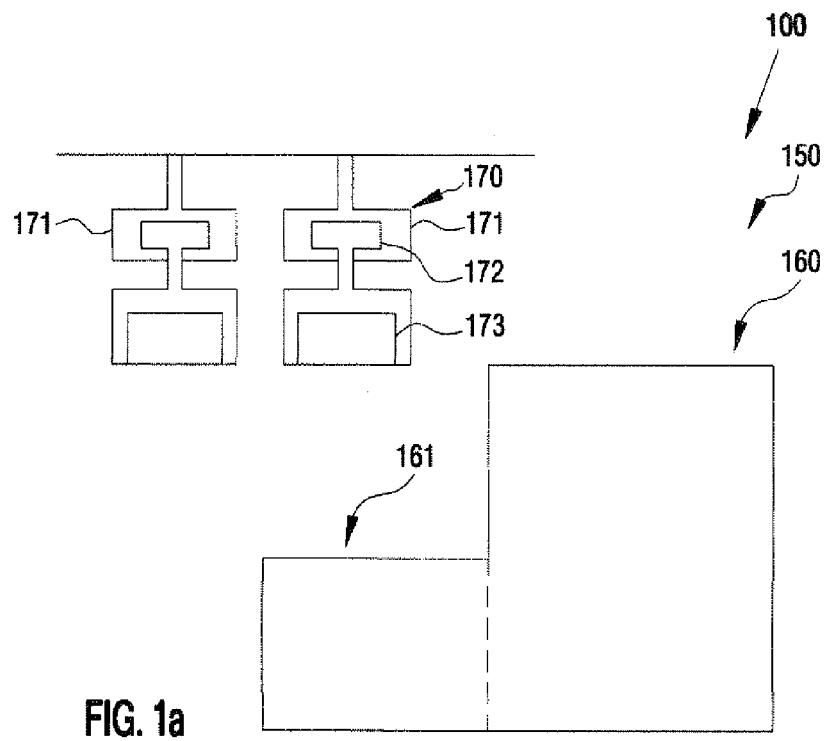
FIGS. 1a-1b schematically illustrate a cross-sectional view and a top view, respectively, of a manufacturing environment including an overhead transport system that exchanges transport carriers with load ports of a process tool according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the subject matter disclosed herein relates to methods and systems used in advanced manufacturing environments, such as semiconductor facilities, or any other production facilities for manufacturing or processing microstructural products, wherein an enhanced flexibility in exchanging substrate carriers between an automated transport system and respective process tools may be achieved during very different process situations, such as the processing of small lot sizes, while the number of load ports may be maintained at a low number, thereby saving on investment costs and floor space in the manufacturing environment. The enhanced flexibility may be achieved by appropriately dealing with the problem of small carrier exchange times or even negative carrier exchange times, as may be encountered during various operational scenarios when small lot sizes are to be processed for a given number of load ports designed to maintain a substantially continuous operation for a large lot size. Thus, for increasing the "efficiency" of a tool internal interface comprising a given number of load ports, it is contemplated in the present disclosure to reduce the idle times of substrate carriers by allowing operational modes, in which, in one option, empty substrate carriers may be removed from a respective load port so that the corresponding load port may be available for a further carrier exchange event, thereby increasing the effective carrier exchange time with respect to the automated transport system.

In another option, an operating mode is contemplated in which substrate carriers having supplied the substrates to the tool internal process modules may be allowed to receive other substrates that have been processed by the tool, thereby significantly reducing the idle time of the substrate carriers. While, in the former option, the idle time of any substrate carriers may be minimized, in the latter option, the idle times may be significantly reduced for the benefit of a lower number of transport activities per substrate carrier. In order to realize these operational modes, local buffer places are provided such that the buffer system acts as an interface between the transport system and the load ports of the process tool, wherein "one end" of the interface, i.e., the buffer system, that is connected to the transport system enables the receipt and supply of full substrate carriers according to the capabilities of the transport system, while the "other end" of the buffer system interacts with the load ports of the process tool at significantly reduced access times while also providing the required buffer places for full and empty substrate carries that may have temporarily been stored in order to enhance the efficiency of the individual load ports of the process tool. In some illustrative embodiments, the overhead buffer system may comprise a dedicated vehicle that is movable in a reciprocating manner above the respective load ports independently from any transport activities of the automated transport system, for instance, on the basis of a respective rail allocated to the dedicated vehicle, which may therefore allow short access times with respect to the buffer places and the load ports. Consequently, the idle times of substrate carriers in which, in conventional strategies, the load ports are blocked for further activities may be efficiently reduced, thereby enhancing the efficiency of each individual load port while at the same time the actual carrier exchange time with respect to the transport system may be maintained at a level that is within the capabilities of the transport system without having to increase the number of load ports. Furthermore, the reduced access times for serving the buffer places of the buffer system and the load ports of the process tool may be realized on the basis of conventional overhead transport components, such as transport vehicles, sidetrack buffers, which are combined to a buffer system as disclosed herein, and which may be installed without consuming floor space in the manufacturing environment since all the components may be installed in the clean room ceiling and may partially be positioned above the respective process tool.

Consequently, by using the techniques disclosed herein, an undesired loss of utilization of cost intensive production tools, such as lithography tools and related process tools, may be significantly reduced or be substantially avoided for a given hardware in a manufacturing environment when reducing the number of substrates per lot or when frequently operating lots of small size concurrently with a standard lot size of, for example, 25 substrates per carrier. Even for highly sophisticated production scenarios, for instance, assuming only a few substrates per carrier, such as only one substrate per carrier, the number of load ports required per equipment may be restricted to a reasonable number due to the enhanced flexibility in load port availability and utilization based on the local buffering regime disclosed herein.

It should be appreciated that the illustrative methods and systems disclosed herein are particularly advantageous in the context of complex manufacturing environments as are typically encountered in facilities for producing or processing microstructure devices, such as integrated circuits and the like, since, in this case, a plurality of different product types are to be processed in a highly complex sequence of process steps. The principles of the subject matter disclosed herein may, however, also be applied to any complex manufacturing environment in which respective entities are delivered to a plurality of different process tools which may require a substantially continuous supply for meeting throughput criteria. Consequently, the subject matter of this application should not be considered as being restricted to semiconductor facilities unless such restrictions are explicitly set forth in the specification and/or the appended claims.

Generally, in typical manufacturing environments, work pieces, which will also be referred to as substrates in the case of semiconductor processing, may at least temporarily be grouped into specific entities which require, at least for a part of the entire process flow, to be passed through one or more process steps. The corresponding entities or groups may typically comprise a plurality of substrates wherein, in conventional strategies, a standard size of the group or lot may be used, which may be 25 substrates for a typical semiconductor facility processing substrates of 200 mm diameter and 300 mm diameter. As previously explained, the process tools and the respective scheduling regime used for controlling the material exchange between the process tools and the automated transport system may be designed so as to obtain a desired high throughput, which may involve extended periods of a continuous operation of the process tools. When the number of substrates per group or lot is reduced or when a significant number of groups with reduced size may be present in the manufacturing environment, respective throughput-related issues may occur due to a reduction of the carrier exchange time, which may even result in a negative carrier exchange time, as previously described. The subject matter disclosed herein, therefore, provides techniques for providing an appropriate material handling strategy to avoid negative carrier exchange times for a plurality of manufacturing scenarios, including the processing of small lot sizes for a given hardware configuration of the process tools in the manufacturing environment. Furthermore, for a manufacturing environment to be newly installed, the design of the associated load port interfaces may be based on the techniques disclosed herein, thereby providing a high degree of flexibility in material handling regimes including small lot sizes, while nevertheless allowing a reduced number of load ports compared to conventional strategies.

Figure 1B:
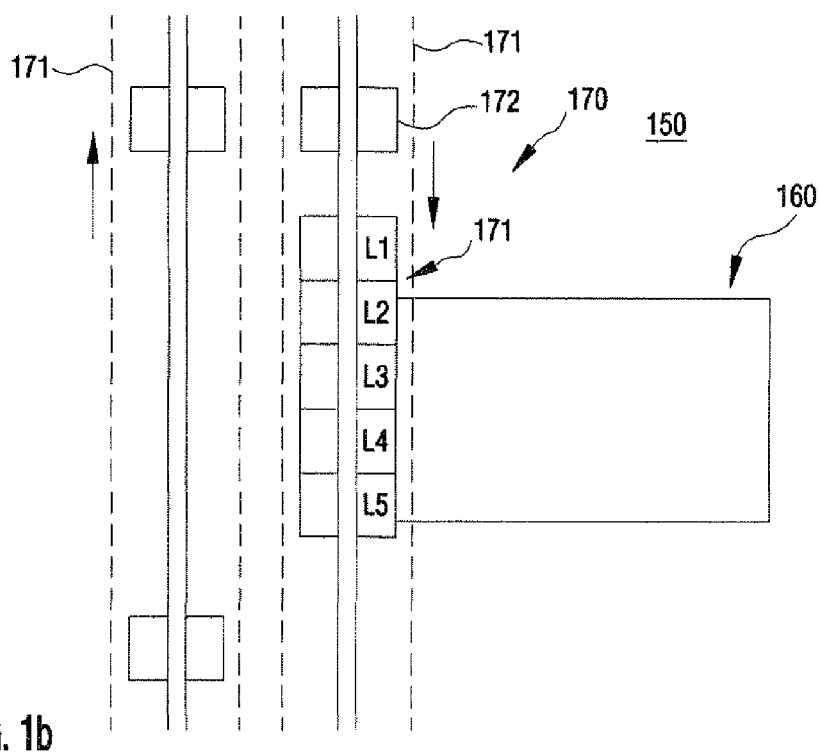
Figure 2A:
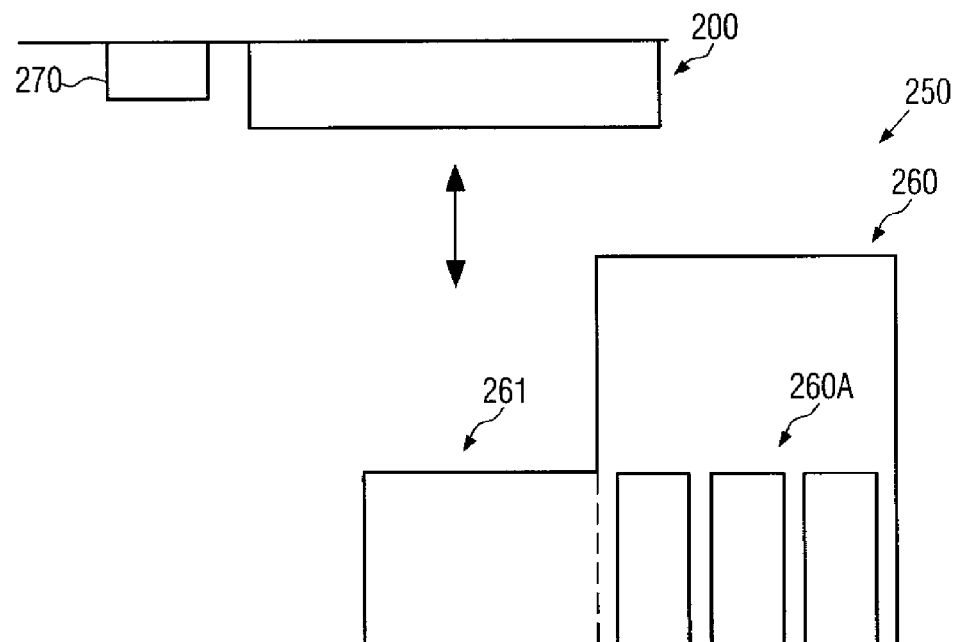
FIGS. 2a-2b schematically illustrate a cross-sectional view and a top view, respectively, of a manufacturing environment including an overhead buffer system that is used as an interface between an overhead transport system and load ports of a process tool according to illustrative embodiments.

FIG. 2a schematically illustrates a cross-sectional view of a manufacturing environment 250, which, in one illustrative embodiment, represents a portion of a semiconductor facility, which is to be understood as a manufacturing environment for processing or manufacturing microstructure devices, such as integrated circuits, micromechanical devices, optoelectronic devices and the like. The manufacturing environment 250 may comprise one or more process tools 260, some of which may represent highly cost intensive process tools, such as lithography tools and the like. Furthermore, it should be appreciated that the process tool 260 may be provided in the form of an assembly of a plurality of process tools or process modules 260A performing a plurality of related process steps, wherein the respective substrates are passed through the various modules and process steps on a single substrate basis. Furthermore, the process tool 260 may be associated with a carrier exchange interface 261 that is designed to receive and provide substrate carriers used for transporting one or more substrates therein. For instance, in semiconductor facilities, standard transport carriers or substrate carriers are used, which may be referred to as front opening unified pods (FOUP), which may be handled by standard mechanisms that are, for convenience, not shown in FIG. 2a. Furthermore, the manufacturing environment 250 may comprise an automated overhead transport system 270, which is configured to convey substrate carriers within the manufacturing environment 250, for instance, by picking up a transport carrier from a source tool and conveying the carrier to a destination tool, such as the process tool 260. For example, the transport system 270 may have a configuration as previously described with reference to FIGS. 1a-1b. Moreover, at least some of the process tools in the manufacturing environment 250, such as the tool 260, may be associated with an overhead buffer system 200 which may act as an interface operatively connecting the transport system 270 to the load port interface 261 of the tool 260. That is, contrary to conventional strategies, the automated transport system 270 may not directly deliver or pick up any substrate carriers from load ports of the tool internal interface 261, but may exchange the substrate carriers with the buffer system 200. The buffer system 200, on the other hand, interacts with the load port interface 261 with a significantly reduced access time compared to the corresponding carrier exchange time associated with the transport system 270. That is, the buffer system 200 comprises a plurality of buffer places dedicated for exchanging full and empty substrate carriers with the load ports of the interface 261 with reduced access times in a substantially independent manner with respect to transport activities in the system 270, which may supply and pick up transport carriers to and from the buffer system 200 according to the transport capabilities of the system 270.

During operation of the manufacturing environment 250, an appropriate operating mode may be used in the interface 261 in combination with the buffer system 200 so as to reduce the effective idle time of empty substrate carriers positioned on respective load ports of the interface 261, as is previously explained. That is, an operating mode may be selected in which substrate carriers may be removed by exchange with the buffer system 200 after unloading the respective substrates into the process tool 260 and thereafter the empty substrate carrier may temporarily be stored in the buffer system 200. Concurrently, the transport system 270 may supply full substrate carriers including substrates to be processed in the tool 260 and may pick up full substrate carriers including substrates that have been processed in the tool 260, wherein the system 270 operates on the basis of an appropriate carrier exchange time that enables a substantial continuous operation of the tool 260. Consequently, the continuous supply of substrates to the tool 260 may be achieved on the basis of a low number of load ports in the interface 261, since each load port is available for more carrier exchange events compared to conventional strategies, as previously described.

Moreover, in a different operating mode, the respective idle time of empty substrate carriers may be reduced by allowing different substrates to return into the empty carrier, wherein, also in this case, the buffer system 200 provides the capability of temporarily storing empty carriers, which may be necessary during certain operational phases in this operating mode. Similarly as before, the buffer system 200 further provides a carrier exchange with the transport system 270 independently from any transport activities between the system 200 and the interface 261.

Figure 2B:
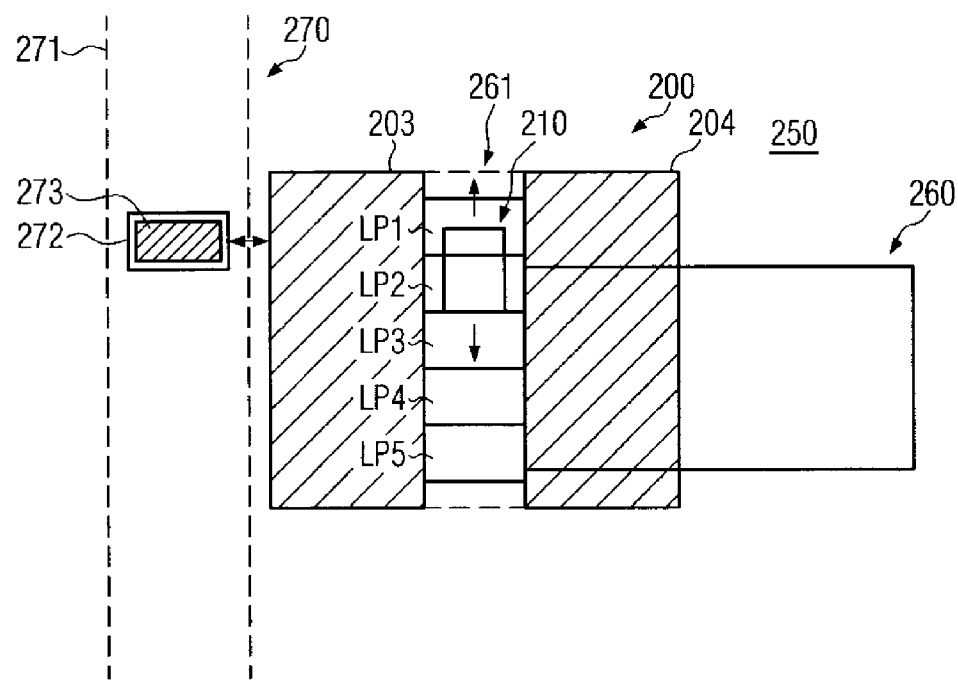

FIG. 2b schematically illustrates a top view of the manufacturing environment 250 according to one illustrative embodiment, in which the interface 261 may comprise five load ports LP1, LP2, LP3, LP4, LP5. Moreover, the buffer system 200 may comprise one or more buffer places 203 that, in one illustrative embodiment, are designed to be directly accessible by the transport system 270. For example, the one or more buffer places 203, which may also be referred to as transfer places for exchanging full transport carriers with the system 270, may be provided in the form of sidetrack buffers which may be loaded and unloaded on the basis of an appropriately designed vehicle 272 of the system 270. As previously explained, the vehicle 272 may be moved along a rail 271 which extends through the manufacturing environment 250 in an appropriate manner so as to interconnect the respective process tools contained therein. Thus, during operation of the system 270, the vehicle 272 may include a transport or substrate carrier 273 which may be positioned next to one of the buffer places 203 to enable a transfer of the carrier 273 into this buffer place 203. Similarly, an empty vehicle 272 may be appropriately positioned next to the one or more buffer places 203 so as to receive a full substrate carrier from the system 200 for transport to a predefined destination within the environment 250. Moreover, the buffer system 200 may comprise one or more storage places 204, which may be used for temporarily storing empty substrate carriers. Furthermore, the buffer system 200 may comprise a transport mechanism 210 for operatively connecting the buffer places 203, 204 with the load ports of the interface 261 independently of any transport activities of the system 270. In one illustrative embodiment, the transport mechanism 210 may be comprised of transport components also used in the system 270, such as corresponding rails, vehicles and the like, as will be described in more detail with reference to FIG. 2c. Consequently, a high degree of compatibility with existing technology standards may be achieved while nevertheless a significantly reduced access time for the load ports LP1, LP2, LP3, LP4, LP5 for supplying and removing substrate carriers may be achieved. In one illustrative embodiment, the buffer places 203, i.e., the transfer places for receiving and supplying full substrate carriers, and the buffer places 204, i.e., storage places for empty substrate carriers, may be positioned in an opposite relationship centered around the transport mechanism 210. In this case, each of the transfer places 203 that is directly accessible by the system 270 and each of the storage places 204 may be directly accessed with a minimum of transport activities of the mechanism 210 when provided in the form of a dedicated overhead vehicle.

Figure 2C:
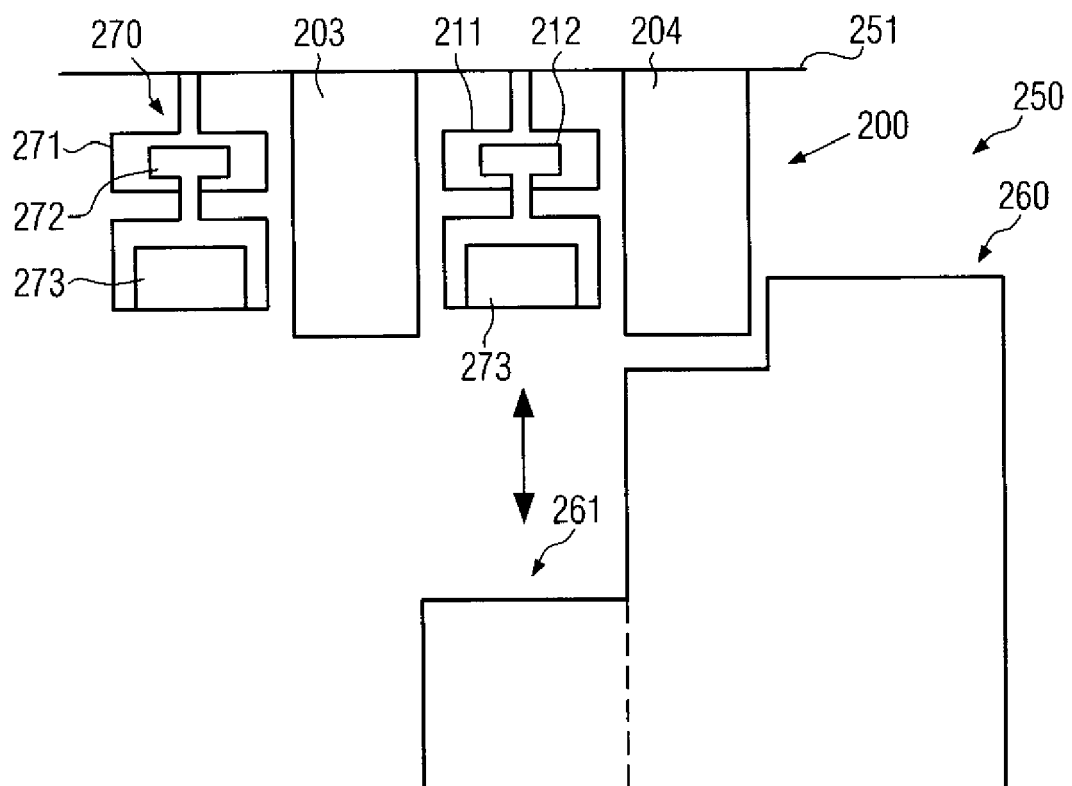
FIG. 2c schematically illustrates a cross-sectional view of an overhead buffer system according to further illustrative embodiments.

FIG. 2c schematically illustrates the manufacturing environment 250 including the buffer system 200 according to further illustrative embodiments. As shown, the buffer system 200 may comprise the transfer places 203 in the form of sidetrack buffer places, which may enable direct communication with the transport system 270 by using an appropriate carrier handling mechanism for sidewardly transferring the carriers 273 from and to the transfer places 203. Similarly, the transport mechanism 210 may comprise a dedicated rail 211 which, in the embodiment shown, may be positioned at substantially the same height level as the rail 271 of the transport system 270, thereby providing the possibility of directly accessing the transfer places 203 by means of a dedicated vehicle 212, which may have the same configuration as the vehicle 272 used in the transport system 270. Furthermore, the vehicle 212 may also directly "communicate" with the storage places 204, which may be used for temporarily storing empty carriers, as previously described. Moreover, the storage places 204 may be located above a portion of the process tool 260, thereby efficiently using the available area of the ceiling 251 of the respective clean room of the manufacturing environment 250. Consequently, the rail 211 may be efficiently positioned above the respective load ports 261 to enable a vertical supply and pick up of carriers from the load ports 261 using well-established mechanisms for hoisting up and down carriers.

During operation of the manufacturing environment 250, the buffer system 200 may provide enhanced load port availability due to reduced access times by the system 200 and the potential for temporarily storing full and empty substrate carriers, as previously explained.

Figure 2D:
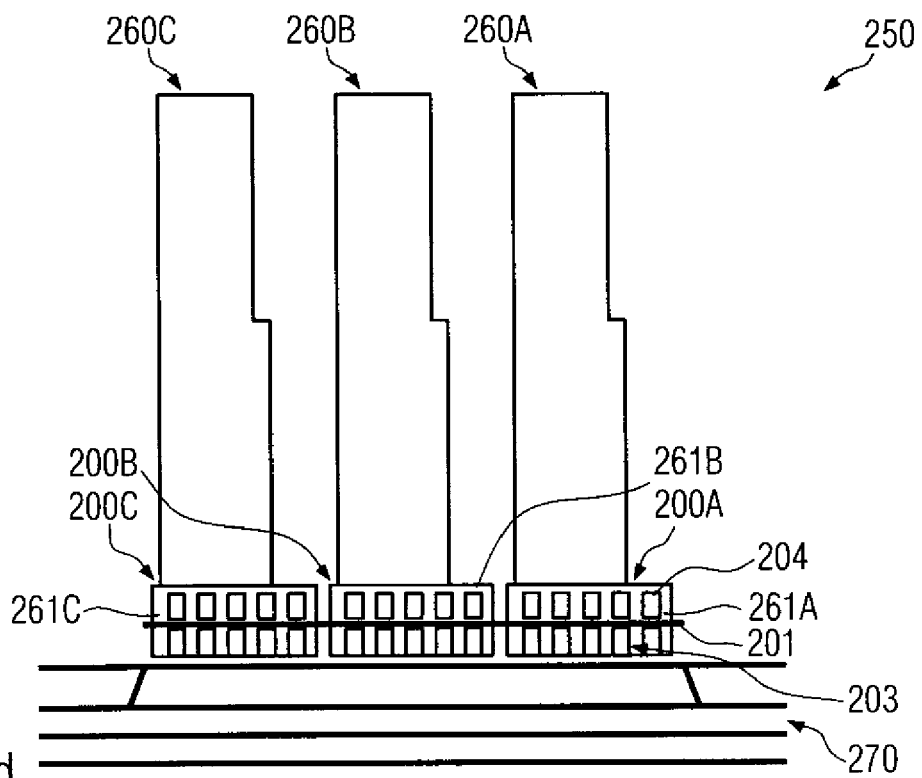
FIG. 2d schematically illustrates a top view of a manufacturing environment, wherein a plurality of illustrative overhead buffer systems are provided according to still further illustrative embodiments.

FIG. 2d schematically illustrates a top view of the manufacturing environment 250 according to further illustrative embodiments. As shown, the environment 250 may comprise a plurality of process tools or process tool clusters 260A, 260B, 260C, each comprising an associate interface or load port assembly 261A, 261B, 261C. Furthermore, each of the load port assemblies 261A, 261B, 261C may be associated with a respective buffer system 200A, 200B, 200C, each of which may have a configuration as previously described with reference to FIGS. 2a-2c. For instance, in the embodiment shown, the buffer systems 200A, 200B, 200C may have a substantially identical configuration which may be designed so as to comply with the operational characteristics of the associated process tools 260A, 260B, 260C. In other illustrative embodiments, the buffer systems 200A, 200B, 200C may be individually dimensioned with respect to the individual capabilities of the associated process tools 260A, 260B, 260C and the corresponding load port assemblies 261A, 261B, 261C. For instance, the process tools 260A, 260B, 260C may differ in their throughput, the number of load ports provided and the like. Consequently, the buffer systems 200A, 200B, 200C may be individually adapted to these conditions such that a substantially continuous operation of the tools may be maintained under a variety of process scenarios. In the embodiment shown, the various buffer systems 200A, 200B, 200C may be mechanically coupled by a rail 201 so as to enable, if desired, a "communication" of neighboring buffer systems if specific operating conditions may require dynamically adapting the capability of a respective buffer system.

For example, the storage capacity of one buffer system may be temporarily increased when one or two neighboring buffer systems may be temporarily operated with a reduced total storage capacity without degrading the overall performance of these buffer systems. In this case, the capacity of the individual buffer systems may be dynamically adapted for a given "buffer density" that is installed in the manufacturing environment associated with the process tools under consideration.

In other cases, two or more of the buffer systems 200A, 200B, 200C may be temporarily or permanently "combined" to form a single tool spanning buffer system, which may be operated on the basis of a single dedicated vehicle, when the access time of the vehicle for each of the buffer places and load ports of the two or more tools served by the combined system is within a range as defined by the respective carrier transactions, as previously described. For example, when operating in the mode with reduced carrier transactions, i.e., reducing idle carrier time by allowing different substrates to return to an open carrier positioned on one of the load ports, it may be appropriate to operatively connect the load ports of two or more process tools by a single tool spanning buffer system. In still other embodiments, the "range" of the buffer system may be dynamically adapted to process specific conditions, such as operating mode with respect to enhancing load port availability as discussed above, the number of load ports in the tools under consideration, wherein one dedicated vehicle may perform the carrier transaction requests for two or more process tools.

Moreover, in the embodiment shown, each buffer system 200A, 200B, 200C may have a dedicated vehicle, as is for instance shown in FIG. 2c, wherein one single vehicle may be provided for each of the buffer systems 200A, 200B, 200C. By appropriately varying the "range" of each single vehicle, the storage capacity of one specific buffer system may be increased by reducing the buffer capacity of one or two neighboring buffer systems. However, in other illustrative embodiments, the rail 201 and/or the available range of each vehicle may be restricted to a single buffer system 200A, 200B, 200C, thereby setting a "maximum" operational range with respect to storage capacity and thus performance of each individual buffer system 200A, 200B, 200C. For example, for currently available overhead transport components, the access time for any load port in the assemblies 261A, 261B, 261C may be less than approximately 1 minute, i.e., the required transport activities such as moving to a specific storage place, loading or unloading a substrate carrier, moving to a specific load port, hoisting down the substrate carrier or hoisting up the substrate carrier may take less than approximately 60 seconds. Consequently, within this time range, substrate carriers may be supplied or picked up by any of the systems 200A, 200B, 200C, thereby providing the potential for installing respective operating modes for enhancing load port efficiency, as previously explained.

With reference to FIGS. 3a-3e and 2a-2d various operating scenarios of the manufacturing environment 250 may be discussed in more detail while referring to appropriate timing diagrams. It should be appreciated that these scenarios are of illustrative nature only and other scenarios may also be supported by the local buffer system 200.

Figure 1C:
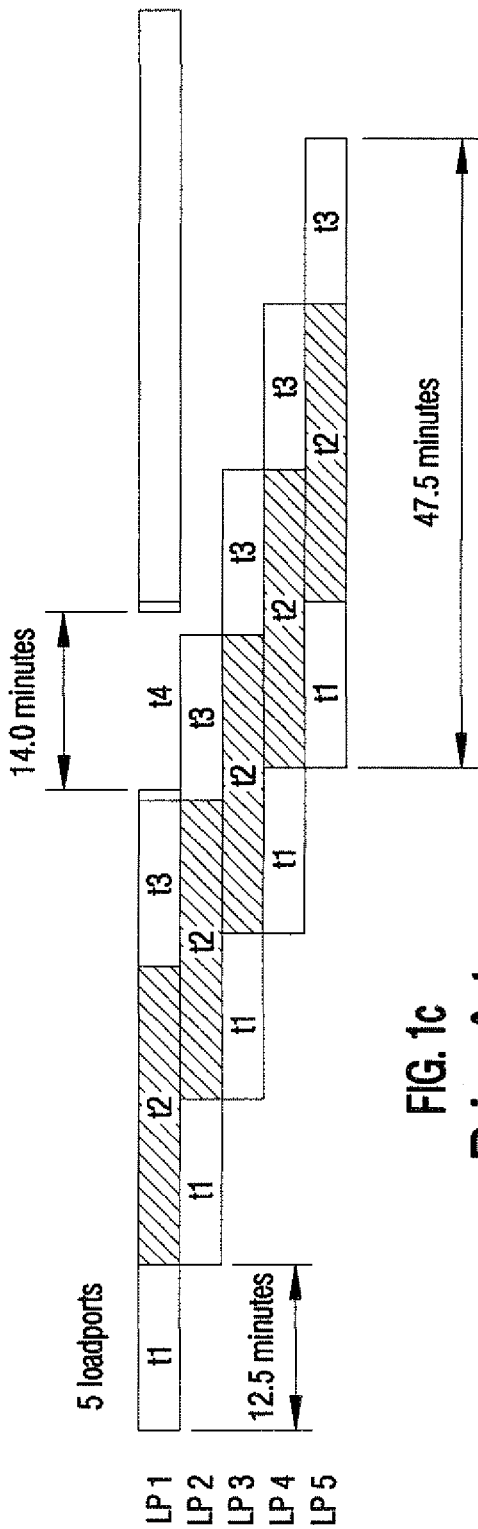
FIGS. 1c-1d schematically illustrate timing diagrams illustrating the dependency of carrier exchange times and idle times of substrate carriers on the number of available load ports for otherwise identical operating conditions, when large lot sizes are used according to conventional strategies.
Figure 1D:
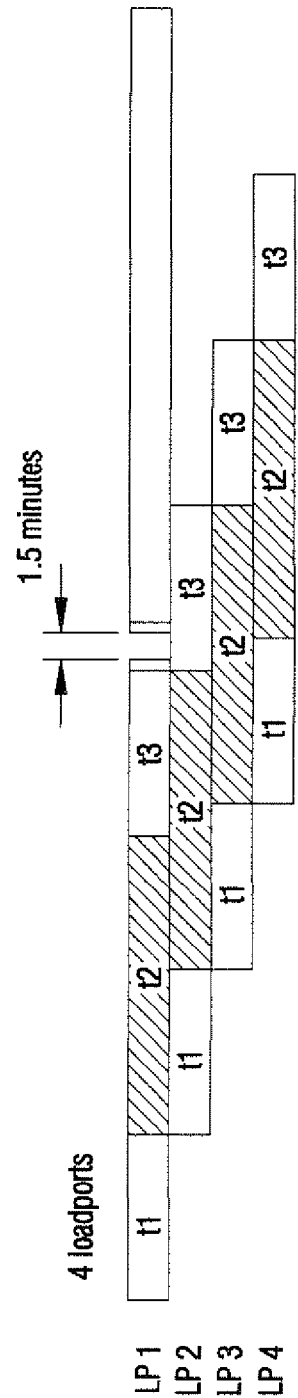
Figure 3A:
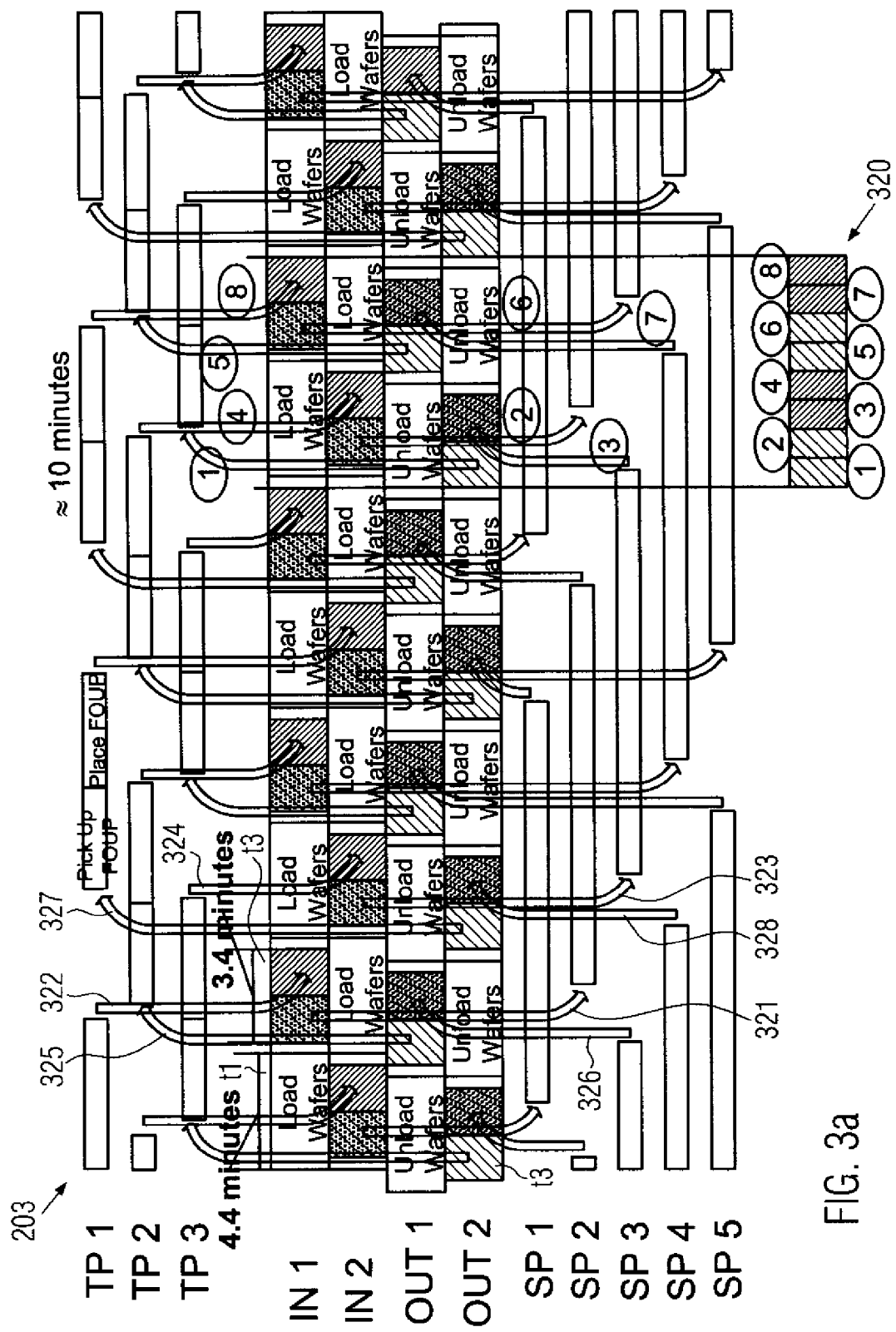
FIG. 3a schematically illustrates a timing diagram for illustrating the carrier exchange based on an overhead buffer system when operating small lot sizes during a continuous operation mode in which empty carriers are removed from respective load ports according to illustrative embodiments.

In FIG. 3a, a timing diagram is shown for an operational mode in which empty carriers are removed from respective load ports after supplying the last substrate to the process tool 260. In this scenario, it may further be assumed that a small lot size, in this example 12 substrates per carrier, may be used as a standard lot size. Furthermore, in this example, the process tool 260 may process 70 substrates until a next substrate is output from the process tool, similarly as is described with reference to FIGS. 1c-1e, wherein it may be assumed that the tool 260 may have a significantly higher overall throughput of 165 substrates per hour. Furthermore, in order to further emphasize the significant advantages of the techniques disclosed herein, the tool 260 is assumed to have only four load ports which, in the case shown in FIG. 3a, are assumed to be grouped into input load ports IN1 and IN2 and output load ports OUT1 and OUT2. It should be appreciated, however, that a corresponding dedication of load ports may not be required and the scenario may also efficiently work when all four load ports may be used as input and output. Furthermore, it is assumed that five storage places SP1, SP2, SP3, SP4, SP5 may be provided in the buffer system 200, such as the storage places 204 for temporarily storing empty substrate carriers. Moreover, three transfer places TP1, TP2, TP3, such as the transfer places 203, may be provided for receiving full transport carriers for exchanging carriers with a transport system 270. For example, in some illustrative embodiments, the buffer system 200 may be provided with the above-described hardware configuration or the buffer system 200 may be dynamically adapted to the process conditions by allocating respective buffer places 203 and 204 from a larger number of available buffer places. For instance, in one of the buffer systems 200A, 200B, 200C of FIG. 2d, three buffer places 203 may be selected as the transfer places 1, 2, 3 of FIG. 3a.

Under the above-specified process conditions, in the input load ports IN1 and IN2, time intervals t1, t3 occur in an alternating manner corresponding to applying substrates from the load port into a process module of the tool 260, removing an empty carrier and obtaining a full carrier, respectively. Due to the throughput of the tool 260 of 165 substrates per hour, the time intervals t1, t3 are 4.4 minutes for 12 substrates, resulting in a time window of 3.4 minutes for removing and obtaining carriers in the load ports IN1, IN2. Similarly, respective time intervals t1, t3 are obtained for the output load ports OUT1, OUT2. Thus, after loading the substrates from a full carrier into the tool 260 during the time interval t1 at load port IN1, the empty carrier may be picked up by the transport system 210 of the buffer system 200 and may be placed in one of the storage places 203, such as storage place SP2, as indicated by arrow 321. Thereafter, load port IN1 may receive a full carrier from one of the transfer places 203, such as transfer place TP1, as indicated by arrow 322. During loading and unloading of carriers in the load port IN1, the substrates of the carrier in load port IN2 may be supplied to the tool and thereafter the empty carrier may be transferred to one of the storage places 204, such as the storage place SP3, as indicated by arrow 323. Next, a full carrier is supplied to load port IN2 from one of the transfer places 203, such as transfer place TP3, as indicated by arrow 324. Similarly, substrates are loaded from the tool 260 into a respective carrier in load port OUT1 and the full carrier is subsequently transferred to one of the transfer places 203, such as TP2, as indicated by arrow 325. Next, an empty carrier may be transferred to load port OUT1 from one of the storage places containing an empty carrier, such as SP3, which may have received an empty carrier during a previous cycle. The corresponding transfer is indicated by arrow 326. Similarly, load port OUT2 may supply a full carrier to one of the transfer places, such as TP1, as indicated by arrow 327, and may thereafter receive an empty carrier from one of the storage places, such as storage place SP4, as indicated by arrow 328.

The sequence 320 illustrates a respective cycle of carrier transport activities between the load ports IN1, IN2, OUT1, OUT2 and the corresponding storage places SP1, SP2, SP3, SP4, SP5 and the transfer places TP1, TP2, TP3 indicated by transport activities 1-8, thereby resulting in 1.1 minutes per carrier transaction in the buffer system. As previously explained, the access time provided by the buffer system 200 on the basis of conventional overhead transport components may be less than one minute, thereby readily meeting the requirements of 1.1 minutes per carrier transaction. Furthermore, as is illustrated in FIG. 3a, the storage time of full carriers in the transfer places may be as long as approximately 5 minutes for carriers provided by the buffer system 200 and for carriers provided by the transport system 270, thereby obtaining a carrier exchange time of approximately 10 minutes, which may be well within the capabilities of the transport system 270. Consequently, due to the provision of the buffer system 200, a continuous operation may be maintained on the basis of a lot size of 12 substrates per carrier, wherein even the throughput of the process tool 260 may be higher compared to the process tool 160, while the corresponding continuous operation of the small lot size may be established on the basis of a reduced number of load ports, i.e., four load ports compared to eight load ports as in conventional strategies, as illustrated in FIG. 1e.

Figure 3B:
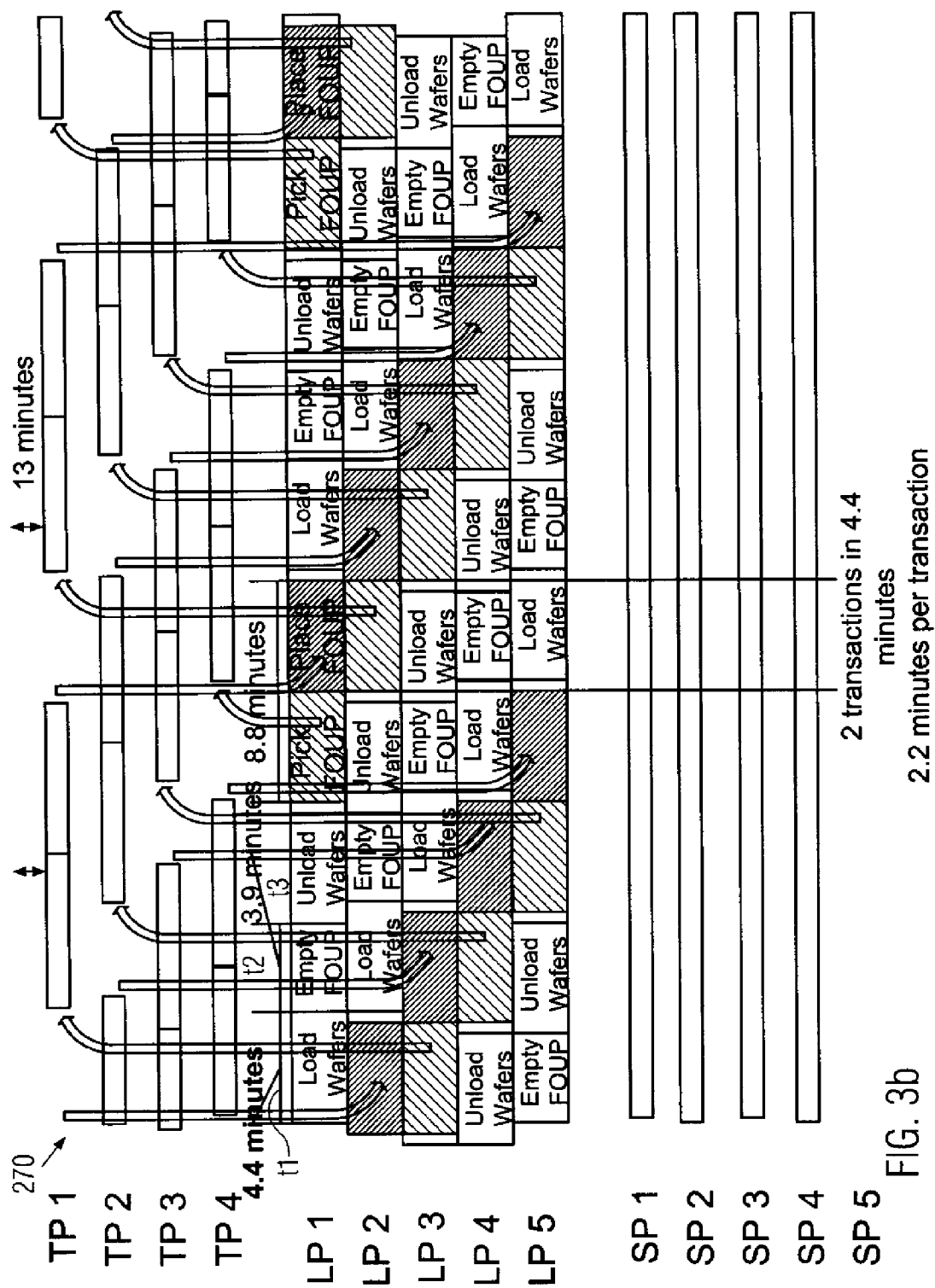
FIG. 3b schematically illustrates a timing diagram when operating the manufacturing environment on the basis of a small lot size in an operational mode for refilling substrate carriers at load ports with different substrates according to illustrative embodiments.

FIG. 3b schematically illustrates a timing diagram for an operational scenario in which the load port availability and efficiency may be enhanced by allowing a specific substrate carrier to receive substrates of a different lot while resting at the specific load port. In this scenario, it may also be assumed that the process tool 260 may have a throughput of 165 substrates per hour, while in this case five load ports LP1, LP2, LP3, LP4, LP5 are provided. Furthermore, the buffer system 200 may be provided, for instance, by dynamic adaptation or by a corresponding static hardware configuration, so as to have at least three transfer places TP1, TP2, TP3 while, in the embodiment shown, even a fourth transfer place TP4 may be provided. Although not required for the continuous operation as is illustrated in FIG. 3b, the buffer system 200 may further comprise a plurality of storage places SP1, SP2, SP3, SP4, SP5 for receiving empty carriers which may be used during a restart condition of the process tool 260, as will be described with reference to FIG. 3c. Thus, while, for instance, substrates may be supplied from a carrier on load port LP1 to the tool 260 and substrates may be received by a carrier on load port LP4, an empty carrier may rest on load port 5, while load port LP2 may receive a full carrier from the transfer places 203, while a full carrier including processed substrates may be transferred from load port LP3 to one of the transfer places 203. Thus, any carrier positioned on any of the load ports LP1, LP2, LP3, LP4, LP5 may experience a time interval t1 of 4.4 minutes for supplying substrates, a time period t2 of 3.9 minutes where the carrier is resting with open doors at the load port, a time interval t3 for receiving substrates other than the substrates previously delivered and a time window of 8.8 minutes for picking up the carrier by the buffer system 200 and transferring the carrier to one of the transfer places TP1, TP2, TP3, TP4 and for receiving a full carrier to be processed. As illustrated, two carrier transactions, i.e., transport activities for transferring or picking and placing a carrier may be required within 4.4 minutes resulting in 2.2 minutes per transaction, which may be significantly less compared to the situation described with reference to FIG. 3a. Consequently, in this scenario, any constraints with respect to carrier transactions are significantly relaxed, however, thereby requiring an additional load port. Furthermore, by providing four transfer places, a moderately long carrier exchange time of 13 minutes may be obtained for exchanging carriers with the transport system 270, while using only three transfer places may result in a carrier exchange time of approximately 8.5 minutes, which may also be within the capabilities of the transport system 270. Furthermore, the storage places SP1, SP2, SP3, SP4, SP5 may be provided with empty carriers during a restart situation, thereby providing the potential for supplying empty carriers to each of the load ports in order to enable receipt of processed substrates after 70 substrates are supplied to the process module of the process tool 260. Similarly, the storage places 204 may also be used when changing carrier mode (i.e., change "color" of the carriers), since, in this case, respective carriers of the new color may be previously supplied to the storage places 204 and may then be delivered to the appropriate load ports, thereby providing a substantially seamless change in color of the respective substrate carriers.

It should be appreciated that, in the operational scenario described with reference to FIG. 3b, i.e., reducing the idle time of empty carriers at respective load ports, a significant reduction of the number of required load ports may also be achieved compared to conventional strategies, as for instance shown in FIG. 1e, wherein the process tool 160 even has a significantly lesser continuous throughput compared to the process tool 260.

Figure 3C:
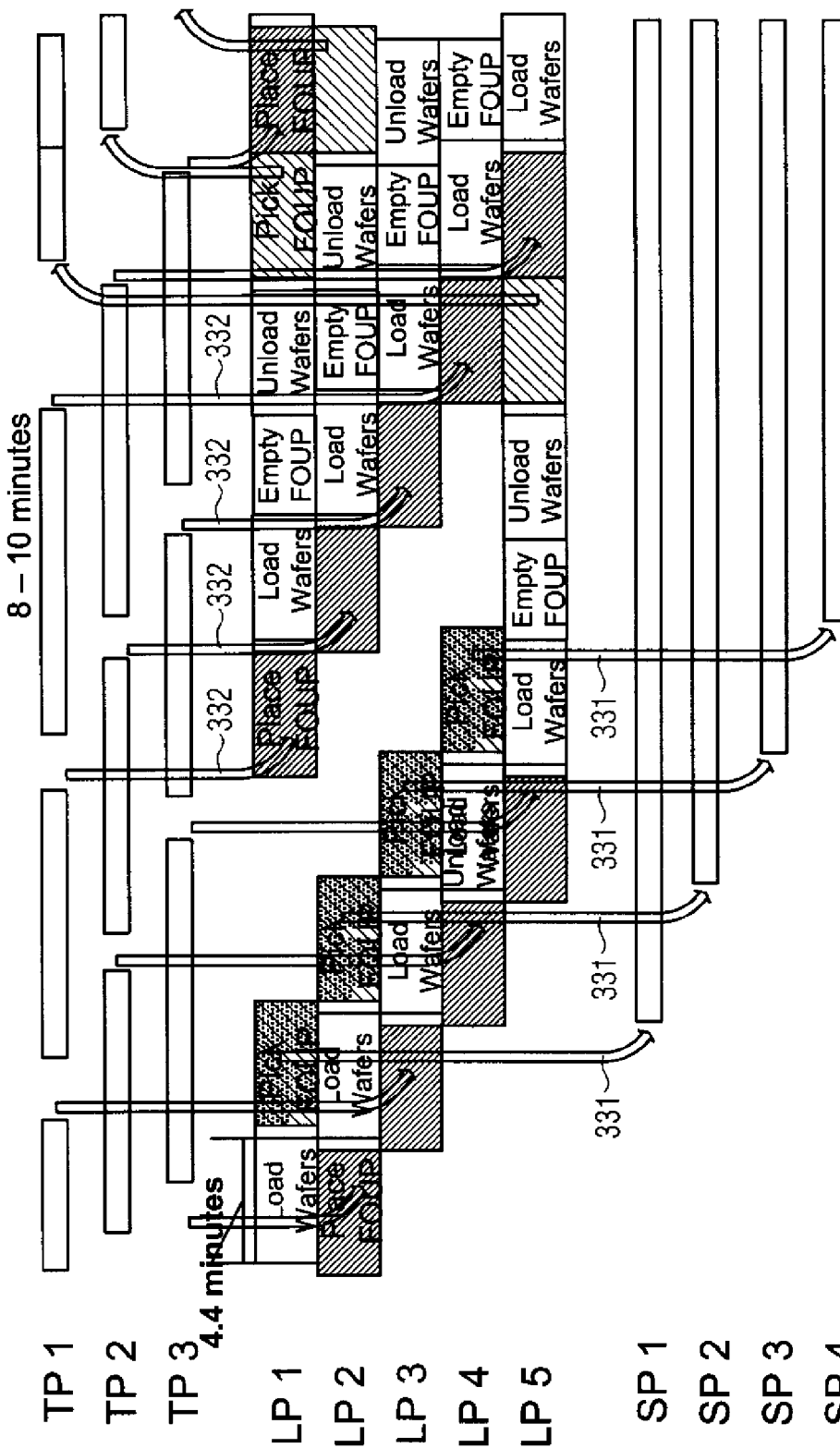
FIG. 3c schematically illustrates the timing diagram for an initial phase of operation of a process tool during start-up according to illustrative embodiments.

FIG. 3c schematically illustrates the operational situation of FIG. 3b wherein, however, a restart situation is illustrated and wherein only three transfer places TP1, TP2, TP3 are provided. Furthermore, only four storage places SP1, SP2, SP3, SP4 may be used in this situation. For example, during a final phase prior to restarting the process tool 260, the first four empty substrate carriers may be stored in respective storage places, as indicated by the arrows 331. The substrate carrier positioned on load port LP5 may remain open and may await the delivery of substrates after restarting the process tool 260. After restart, full carriers may be supplied by the transfer places TP1, TP2, TP3 as indicated by arrows 332, in the same manner as explained above with reference to FIG. 3b wherein, in this case, the reduced number of transfer places results in a reduced carrier exchange time with respect to the transport system 270.

Figure 3D:
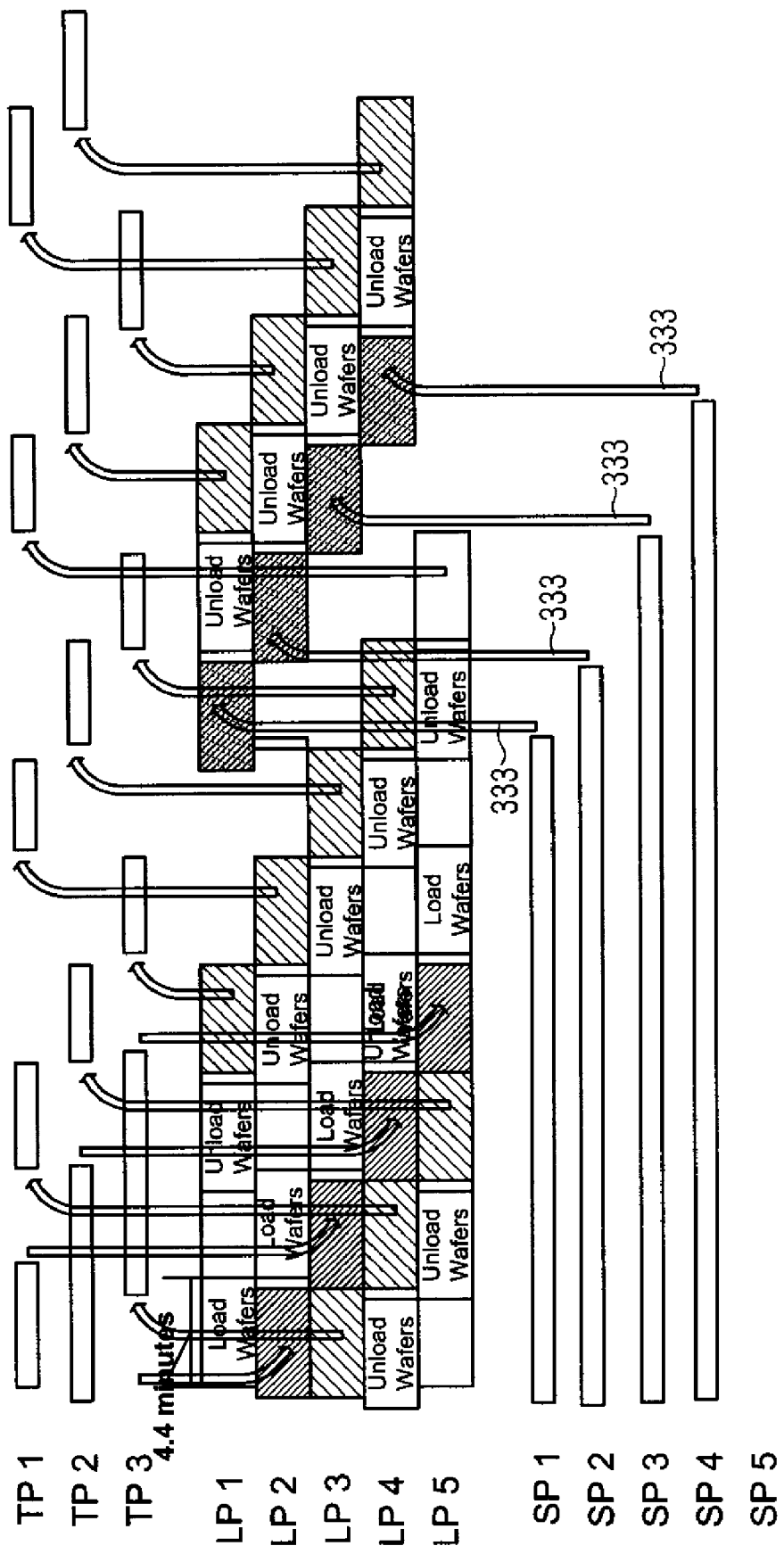
FIG. 3d schematically illustrates a timing diagram for a situation when shutting down the operation of a process tool according to illustrative embodiments.

FIG. 3d schematically illustrates the situation when stopping the processing in the process tool 260, wherein, in this case, after stopping the supply of full carriers, the substrates still present in the process modules of the tool 260 may be unloaded by transferring the empty carriers previously stored in the storage places SP1, SP2, SP3, SP4 to the load ports LP1, LP2, LP3, LP4, as indicated by the arrows 333. Thus, a shutdown of processing in the process tool 260 may not require an additional delivery of empty carriers by the transport system 270, thereby not unduly occupying system resources of the transport system 270.

Figure 3E:
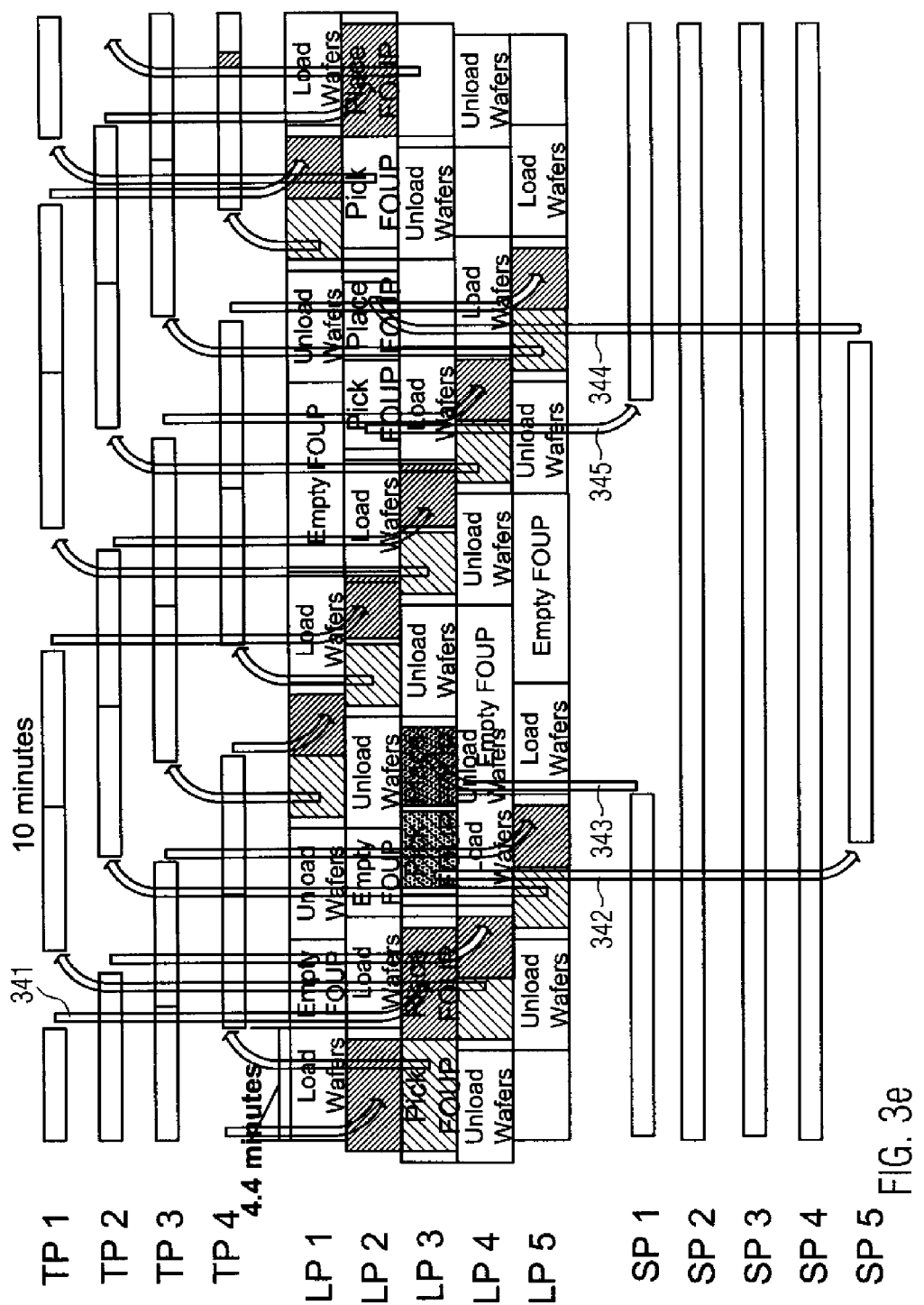
FIG. 3e schematically illustrates a timing diagram during an operating situation in which a pilot substrate may have to be processed in a process tool according to still further illustrative embodiments.

FIG. 3e schematically illustrates a process scenario similar to that described with reference to FIGS. 3a-3d, i.e., the process tool 260 having five load ports LP1, LP2, LP3, LP4, LP5 with empty carriers on respective load ports receiving different substrates. Moreover, in this scenario, the processing of a pilot substrate may be described, wherein, in this case, an additional storage place, such as the storage place SP5, may be provided to ensure a seamless operation and also take into consideration a restart and a process end situation as described with reference to FIGS. 3c-3d. Thus, one of the transfer places 203 may have received a substrate carrier including a pilot substrate, for instance, the transfer place TP1, which may be placed on an available load port, such as LP3, as indicated by arrow 341. The pilot substrate may be loaded into the process tool and thereafter, in one illustrative embodiment, the empty carrier may be picked up and stored in the storage place SP5, as indicated by arrow 342. Thereafter, a respective carrier may be placed on load port LP3 provided by one of the empty carriers in the storage places SP1, SP2, SP3, SP4, as indicated by arrow 343. Consequently, substrates may be unloaded into the empty carrier at load port LP3. Prior to unloading the pilot substrate from the process tool 260, the respective carrier in the storage place 5 may be positioned at the appropriate load port, i.e., LP2 in this case, as indicated by arrow 344, wherein a previously emptied carrier may be removed to the available storage place, i.e., SP1, as indicated by arrow 345. Although a somewhat increased idle time of empty carriers at the respective load ports may be observed due to the presence of the pilot substrate, nevertheless a substantially continuous operation may be obtained on the basis of the configuration as illustrated in FIG. 3e. That is, based on four transfer places 203, a carrier exchange time with the transport system 270 of at least 10 minutes or more may be obtained, while the storage places SP1, SP2, SP3, SP4, SP5 provide a continuous operation even during the presence of a pilot substrate, while also covering restart and process end conditions for the process tool 260, as previously described.

As a result, the subject matter disclosed herein provides methods and systems for enhancing load port efficiency and availability of process tools, in particular of high throughput process tools, by providing a buffer system interface including several buffer places in order to exchange substrate carriers with an automated transport system in a substantially independent manner with respect to transport activities required for operating the load port assemblies of the process tools with enhanced efficiency, i.e., according to operational modes resulting in a reduced idle time of empty carriers at respective load ports. For this purpose, the overhead buffer system may comprise a plurality of storage places for receiving and temporarily storing empty carriers and a plurality of transfer places for exchanging substrate carriers containing substrates to be processed or having been processed in the process tool, wherein conventional overhead components, such as rails, vehicles and the like, may be used for the transfer buffer system. Consequently, an enhanced degree of flexibility is provided with respect to processing different lot sizes in the manufacturing environment, wherein, even for an operational scenario involving the processing of small lot sizes as a standard lot size, may provide a continuous operational mode of respective high throughput process tools, while a significantly lower number of load ports may be required compared to conventional strategies. That is, by dynamically or statically adapting the buffer system, a wide variety of process scenarios may be covered by the subject matter disclosed herein. The buffer system may be installed as an overhead system, thereby not requiring additional floor space in a manufacturing environment, while also ensuring full accessibility by an operator, if required. The buffer system described herein may be configured in conformity with hardware requirements to cover a wide variety of scenarios, wherein a dynamic adaptation may be used for specifically adapting the capability of the overhead buffer system to a respective process scenario.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of exchanging transport carriers with a process tool of a manufacturing environment, the method comprising:
receiving a first transport carrier, which stores a plurality of substrates, in a first one of a plurality of buffer places of a buffer system by directly transferring said first transport carrier from a first vehicle of an overhead transport system to said first buffer place;

transferring said first transport carrier from said first buffer place to a first load port of said process tool using a transport mechanism that is movable independently with respect to said first vehicle;
unloading the plurality of substrates from the first transport carrier into said process tool for processing;
transferring, using the transport mechanism, said first transport carrier to a second one of the plurality of buffer places;
retrieving the plurality of substrates from said process tool using said first transport carrier; and
storing said first transport carrier in said second buffer place between unloading said substrates to said process tool and retrieving the plurality of substrates from said process tool.

2. The method of claim 1, further comprising delivering said first transport carrier from the second buffer place to a second load port of said process tool by using said transport mechanism so that the plurality of substrates can be loaded into said first transport carrier, and transferring said first transport carrier to a third one of said plurality of buffer places of said buffer system.

3. The method of claim 2, further comprising transferring said first transport carrier from the third buffer place to a second vehicle and conveying said first transport carrier to a destination within said manufacturing environment.

4. The method of claim 3, wherein said second vehicle is moved along a dedicated rail in a reciprocating manner so as to serve said plurality of buffer places and a plurality of load ports of said process tool including said first load port.

5. The method of claim 1, further comprising picking up said first transport carrier by said transport mechanism after supplying each member of a first lot of substrates contained therein into a process module of said process tool via said first load port and transferring said empty transport carrier to said second one of said plurality of buffer places.

6. The method of claim 5, further comprising conveying said first transport carrier from said second one of said plurality of buffer places to a load port by said transport mechanism for receiving a lot of substrates having been processed in said process module of said process tool.

7. The method of claim 6, wherein said lot is said first lot previously contained in said first transport carrier.

8. The method of claim 6, wherein said lot differs from said first lot.

9. The method of claim 1, further comprising supplying each member of a first lot of substrates contained in said first transport carrier into a process module of said process tool via said first load port and receiving another lot of substrates in said first transport carrier, said substrates of the another lot having been processed in said process module.

10. A method, comprising:
exchanging one or more substrates contained as one or more groups in one or more substrate carriers between an overhead transport system and an overhead carrier buffer system of a manufacturing environment, said one or more substrates dedicated for processing in a specific process tool of said manufacturing environment; and
exchanging said one or more substrate carriers between said overhead buffer system and load ports of said specific process tool by moving a dedicated vehicle of said overhead buffer system in a reciprocating manner between said load ports so as to supply said one or more substrates to the specific process tool and pick up said one or more substrate carriers from said specific process tool, said dedicated vehicle of said overhead buffer system being movable independently from any vehicles used in said overhead transport system, wherein said one or more substrate carriers are stored in said overhead buffer system after supplying said one or more substrates to the specific process tool and before picking up said one or more substrates from the specific process tool.

11. The method of claim 10, further comprising transferring an empty substrate carrier of said one or more substrate carriers from one of said load ports to said overhead buffer system via said dedicated vehicle so as to temporarily store said empty carrier.

12. The method of claim 11, further comprising transferring said empty substrate carrier to one of said load ports to receive the same one or more groups of substrates previously contained in said presently empty substrate carrier.

13. The method of claim 10, wherein, after processing said one or more substrates in said specific process tool, at least one of said one or more substrate carriers receives substrates other than substrates initially contained therein.

14. The method of claim 13, wherein said at least one substrate carrier is temporarily stored in said overhead buffer system between supplying and receiving said substrates.

15. The method of claim 10, wherein exchanging said one or more substrate carriers between said overhead transport system and said overhead buffer system comprises directly exchanging substrate carriers between transport vehicles of said overhead transport system and buffer places in said overhead buffer system.

16. The method of claim 10, wherein exchanging said one or more substrate carriers between said overhead buffer system and said load ports comprises directly receiving substrate carriers in said dedicated vehicle from a buffer place in said overhead buffer system, moving said dedicated vehicle above a destination load port and directly transferring said substrate carrier to said destination load port.

* * * * *